US011515400B2

(12) United States Patent
Tang et al.

(10) Patent No.: US 11,515,400 B2
(45) Date of Patent: Nov. 29, 2022

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Ruizhi Tang, Shanghai (CN); Jinyu Fu, Shanghai (CN); Lin Liu, Shanghai (CN); Bo Li, Shanghai (CN); Peng Yang, Shanghai (CN); Haojun Huang, Shanghai (CN); Jialei Liu, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 17/009,063

(22) Filed: Sep. 1, 2020

(65) Prior Publication Data

US 2021/0074829 A1 Mar. 11, 2021

(30) Foreign Application Priority Data

Sep. 6, 2019 (CN) .......................... 201910842798.7

(51) Int. Cl.
*H01L 29/66* (2006.01)
*H01L 29/51* (2006.01)
(Continued)

(52) U.S. Cl.
CPC .. *H01L 29/66545* (2013.01); *H01L 21/31155* (2013.01); *H01L 29/513* (2013.01); *H01L 29/66795* (2013.01); *H01L 29/7851* (2013.01)

(58) Field of Classification Search
CPC ........... H01L 21/0228; H01L 21/02164; H01L 21/02274; H01L 21/28194;
(Continued)

(56) References Cited

U.S. PATENT DOCUMENTS 9,768,278 B1* 9/2017 Chui ................. H01L 29/66636
2013/0099320 A1* 4/2013 Lee ..................... H01L 29/4966
438/585

(Continued)

*Primary Examiner* — Monica D Harrison
*Assistant Examiner* — Andre C Stevenson
(74) *Attorney, Agent, or Firm* — Anova Law Group, PLLC

(57) ABSTRACT

A semiconductor structure and a method for forming the semiconductor structure are provided. The method includes: providing a substrate; forming a dummy gate structure including a dummy gate dielectric layer, an initial dummy gate electrode layer, and a first sidewall spacer; forming an isolation layer having a surface lower than or coplanar with the dummy gate structure; forming a dummy gate electrode layer having a surface lower than the isolation layer, and forming a first opening to expose a portion of the first sidewall spacer; forming a modified sidewall spacer from the exposed first sidewall spacer; forming a second opening by removing the dummy gate electrode layer; forming a third opening by removing the dummy gate dielectric layer and the modified sidewall spacer, where top of the third opening has a size larger than bottom of the third opening; and forming a gate structure in the third opening.

17 Claims, 4 Drawing Sheets

(51) Int. Cl.
*H01L 21/3115* (2006.01)
*H01L 29/78* (2006.01)

(58) Field of Classification Search
CPC ......... H01L 21/76224; H01L 21/76829; H01L 21/76877; H01L 23/5226; H01L 29/0649; H01L 29/66545; H01L 29/66795; H01L 29/7851; H01L 21/31155; H01L 29/513
See application file for complete search history.

(56) References Cited

U.S. PATENT DOCUMENTS

| | | | |
|---|---|---|---|
| 2015/0145054 A1* | 5/2015 | Bu | H01L 21/02181 438/197 |
| 2015/0206949 A1* | 7/2015 | Zhao | H01L 21/0217 438/287 |
| 2018/0047638 A1* | 2/2018 | Han | H01L 21/28114 |
| 2018/0166576 A1* | 6/2018 | Wang | H01L 29/7854 |
| 2018/0190781 A1* | 7/2018 | Cheng | H01L 21/823431 |
| 2019/0006506 A1* | 1/2019 | Greene | H01L 29/6656 |
| 2020/0058790 A1* | 2/2020 | Chiang | H01L 21/76825 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201910842798.7, filed on Sep. 6, 2019, the entirety of which is incorporated herein by reference.

FIELD OF THE DISCLOSURE

The present disclosure generally relates to the field of semiconductor manufacturing and, more particularly, relates to a semiconductor structure and a fabrication method thereof.

BACKGROUND

In semiconductor very-large-scale integration (VLSI), semiconductor devices have been developing towards higher component density and higher degree of integration, in order to achieve more functions such as higher operation speed and larger data storage capacity. Although a size of a complementary metal oxide semiconductor (CMOS) transistor has become smaller than before, existing CMOS transistors still cannot meet the needs for higher degree of integration. Multi-gate devices have become commonly used devices.

A fin field-effect transistor (FinFET) is a common multi-gate device and may provide a high driving current and a high degree of integration. However, when the process node is further reduced, how to further improve the device performance of the FinFET has become an urgent issue to be solved. The disclosed methods and device structures are directed to solve one or more problems set forth above and other problems.

BRIEF SUMMARY OF THE DISCLOSURE

To address the problems described above, embodiments and implementations of the present disclosure provide a semiconductor device and fabrication method thereof to improve the device performance of the semiconductor structure.

One aspect of the present disclosure includes a method for forming a semiconductor structure, including: providing a substrate; forming a dummy gate structure over the substrate, where the dummy gate structure includes: a dummy gate dielectric layer, an initial dummy gate electrode layer on the dummy gate dielectric layer, and a first sidewall spacer on sidewalls of the dummy gate dielectric layer and the initial dummy gate electrode layer; forming an isolation layer over the substrate, where the isolation layer exposes a surface of the dummy gate structure, and a surface of the isolation layer is lower than or coplanar with the surface of the dummy gate structure; forming a dummy gate electrode layer by removing a portion of the initial dummy gate electrode layer, where a surface of the dummy gate electrode layer is lower than the surface of the isolation layer, and a first opening exposing a portion of a sidewall surface of the first sidewall spacer is formed in the isolation layer; performing a modification process on the first sidewall spacer exposed by the first opening to form a modified sidewall spacer from the exposed first sidewall spacer; forming a second opening in the isolation layer by removing the dummy gate electrode layer at a bottom of the first opening; forming a third opening in the isolation layer by removing the dummy gate dielectric layer at a bottom of the second opening and the modified sidewall spacer, where a size of top of the third opening in a direction parallel to a surface of the substrate is larger than a size of bottom of the third opening in the direction parallel to the surface of the substrate; and forming a gate structure in the third opening.

Optionally, the modification process includes an ion implantation process.

Optionally, parameters of the ion implantation process include: an ion type, including argon ion, fluoride ion, phosphorus ion, oxygen ion, silicon ion, or a combination thereof; an ion implantation angle in a range of approximately 15°-60°; ion energy in a range of approximately 10 keV-60 keV; and an ion dose in a range of approximately $1\times10^{15}$ atoms/cm$^3$-$5\times10^{16}$ atoms/cm$^3$.

Optionally, removing the dummy gate dielectric layer at the bottom of the second opening and the modified sidewall spacer includes a dry etching process.

Optionally, an etching gas of the dry etching process includes a mixed gas of hydrogen fluoride and ammonia gas.

Optionally, the method further includes while performing the modification process on the first sidewall spacer, performing the modification process on the isolation layer to convert a top portion of the isolation layer into a modified isolation layer on a remaining portion of the isolation layer.

Optionally, when removing the dummy gate dielectric layer at the bottom of the second opening and the modified sidewall spacer by etching, an etching rate of the dummy gate dielectric layer is greater than an etching rate of the modified isolation layer, and an etching rate of the modified sidewall spacer is greater than the etching rate of the modified isolation layer.

Optionally, a material of the first sidewall spacer includes a low dielectric constant material having a dielectric constant less than 3.9. The low dielectric constant material includes an inorganic porous material, an organic porous material, or a combination thereof. The inorganic porous material includes a silicon oxide porous material, a silicon nitride porous material, a compound containing silicon, nitrogen, oxygen and carbon, or a combination thereof. The organic porous material includes a polyimide porous material, a polyethylene porous material, a polysilazane porous material, or a combination thereof.

Optionally, after forming the third opening and before forming the gate structure in the third opening, the method further includes forming a transition layer at a bottom of the third opening.

Optionally, the transition layer is made of a material including silicon oxide.

Optionally, forming the transition layer includes an atomic layer deposition process, a chemical vapor deposition process, a thermal treatment process, or a combination thereof.

Optionally, forming the first opening by removing the portion of the initial dummy gate electrode layer includes a dry etching process.

Optionally, forming the second opening by removing the dummy gate electrode layer at the bottom of the first opening includes a wet etching process.

Optionally, the gate structure includes a gate dielectric layer, a work function layer on the gate dielectric layer, and a gate electrode layer on the work function layer.

Optionally, forming the gate structure includes: forming a gate dielectric material layer on an inner wall of the third opening, forming a work function material layer on the gate dielectric material layer, forming a gate electrode material layer on the work function material layer, and planarizing the gate electrode material layer, the work function material layer and the gate dielectric material layer until the surface of the isolation layer is exposed to form the gate structure in the third opening.

Optionally, the substrate includes a base and a fin on the base, and the dummy gate structure is across the fin.

Optionally, a height of the removed portion of the initial dummy gate electrode layer in a direction perpendicular to the surface of the substrate is approximately ⅓ to ½ of a height of the initial dummy gate electrode layer; and the height of the removed portion of the initial dummy gate electrode layer is in a range of approximately 250 nm-500 nm.

Another aspect of the present disclosure includes a semiconductor structure, including: a substrate; a gate structure formed over the substrate; a first sidewall spacer formed over the substrate on a side of the gate structure; and a second sidewall spacer formed over the substrate on a side of the first sidewall spacer. The gate structure includes a gate dielectric layer, a work function layer on the gate dielectric layer, and a gate electrode layer on the work function layer. The second sidewall spacer has a height greater than the first sidewall spacer, and the gate dielectric layer is formed at least on sidewalls of the first sidewall spacer and the second sidewall spacer.

Optionally, the gate dielectric layer is further formed on a top surface of the first sidewall spacer.

Optionally, the semiconductor structure further includes a transition layer formed between the gate dielectric layer and the substrate, and between first sidewall spacers.

Compared to the existing technology, the technical solutions of the present disclosure have the following advantages.

In the disclosed method for forming the semiconductor structure, the modification process may be performed on the first sidewall spacer exposed by the first opening to form the modified sidewall spacer. Thus, when removing the dummy gate dielectric layer, the modified sidewall spacer may have a substantially large etching rate, and the modified sidewall spacer may be simultaneously removed while removing the dummy gate dielectric layer. Therefore, the size of top of the subsequently formed third opening in the direction parallel to the surface of the substrate may be larger than the size of bottom of the third opening in the direction parallel to the surface of the substrate. When subsequently forming the gate structure in the third opening, the material of the gate structure may easily fill the third opening to form the gate structure with a dense structure, such that the formed gate structure may have desired device performance.

In addition, the modification process may be an ion implantation process. The implanted ion may include argon ion, fluoride ion, phosphorus ion, oxygen ion, silicon ion, or a combination thereof. The argon ion, fluoride ion, phosphorus ion, oxygen ion, or silicon ion may have a substantially large ion radius. After the ions enter the first sidewall spacer, the structural properties of the first sidewall spacer may change. Therefore, under the process condition of removing the dummy gate dielectric layer, the modified sidewall spacer may have a substantially large etching rate, and the modified sidewall spacer may be simultaneously removed while removing the dummy gate dielectric layer.

Further, the modification process may be performed on the isolation layer to form a modified isolation layer, and when removing the dummy gate dielectric layer, the modified isolation layer may have an etching rate less than the dummy gate dielectric layer. Therefore, when removing the dummy gate dielectric layer, the modified isolation layer may be etched to a lesser extent. The height of the isolation layer may determine the effective height of the subsequently formed gate structure. Therefore, the gate structure subsequently formed in the third opening may have a substantially large height, and the electric field control capability of the gate structure may be substantially strong, thereby improving the device performance of the semiconductor structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
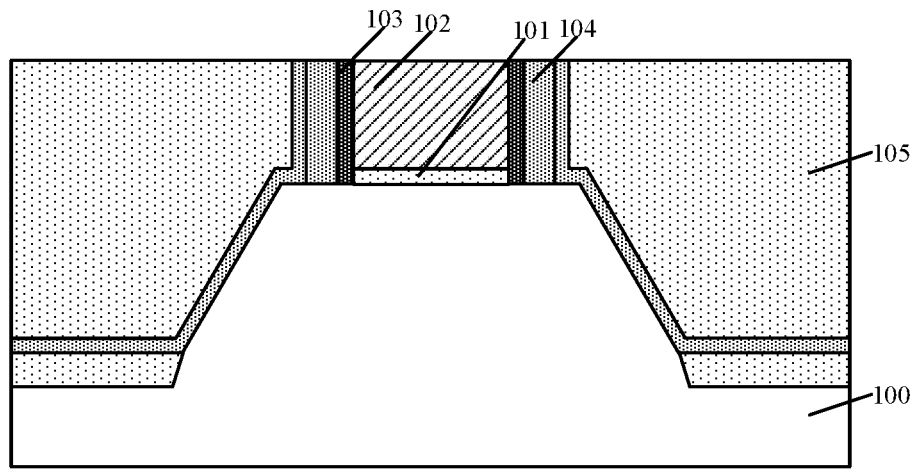
FIGS. 1-3 illustrate semiconductor structures corresponding to certain stages for forming a semiconductor structure.
Figure 2:
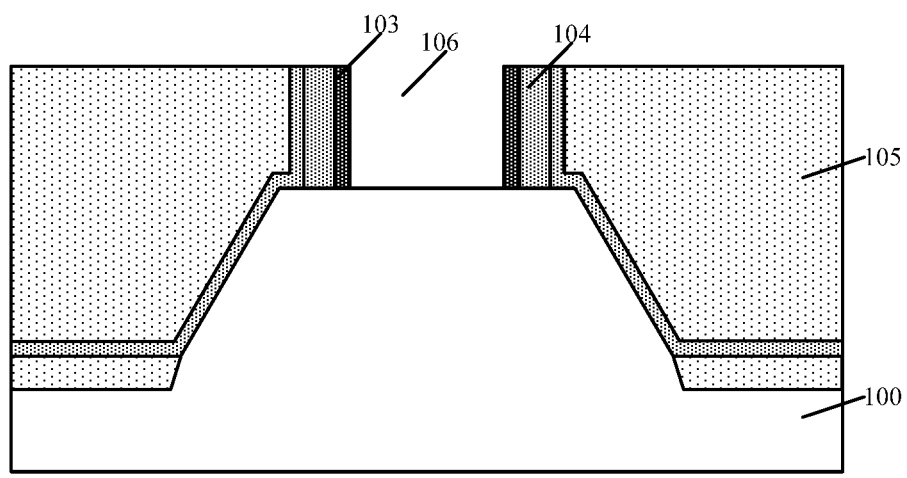
Figure 3:
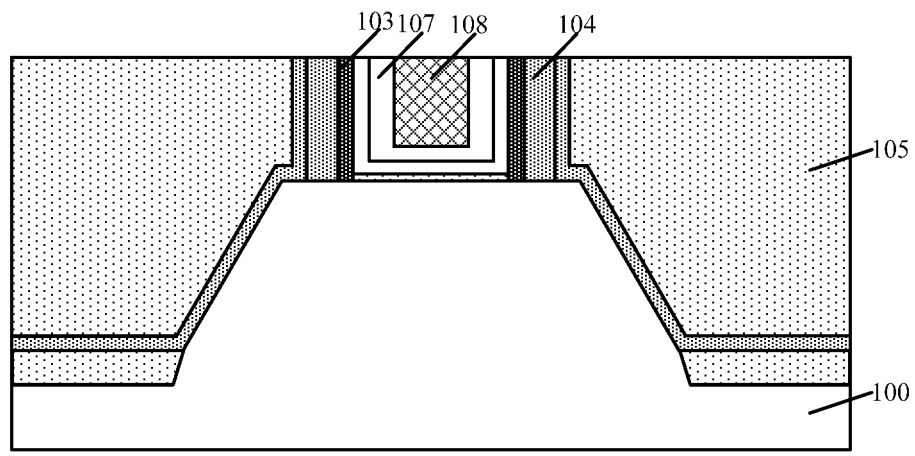

FIGS. 1-3 illustrate semiconductor structures corresponding to certain stages for forming a semiconductor structure. Referring to FIG. 1, a substrate 100 is provided. A fin is formed on the substrate 100, and a dummy gate structure across a length portion of the fin is formed over the substrate 100. The dummy gate structure includes a dummy gate dielectric layer 101, a dummy gate electrode layer 102 on the dummy gate dielectric layer 101, a dielectric layer 103 on the sidewalls of the dummy gate dielectric layer 101 and the dummy gate electrode layer 102, and a sidewall spacer 104 on the sidewall of the dielectric layer 103. An isolation layer 105 is formed over the substrate 100, and the dummy gate structure is located in the isolation layer 105.

Referring to FIG. 2, the dummy gate electrode layer 102 and the dummy gate dielectric layer 101 are removed to form a gate opening 106 in the isolation layer 105. Referring to FIG. 3, a gate structure is formed in the gate opening 106. The gate structure includes a transition layer (not illustrated) at a bottom of the gate opening 106, a gate dielectric layer (not illustrated) on the transition layer and on the inner wall of the gate opening 106, a work function layer 107 on the gate dielectric layer, and a gate electrode layer 108 on the work function layer 107.

In the process of forming the semiconductor structure, on the one hand, when removing the dummy gate electrode layer 102, a portion of the dummy gate electrode layer is first removed by a dry etching process, and then remaining dummy gate electrode layer is removed by a wet etching process. The dry etching process and the wet etching process cause certain damage to the isolation layer 105. Both the dummy gate dielectric layer 101 and the isolation layer 105 are made of silicon oxide. Therefore, when removing the dummy gate dielectric layer 101, the isolation layer 105 is also etched at the same time. Under the combined effect of the processes of removing the dummy gate electrode layer 102 and the dummy gate dielectric layer 101, a height of the isolation layer 105 is reduced. The height of the isolation layer 105 determines an effective height of the subsequently formed gate structure, and the decrease of the height of the isolation layer 105 causes the decrease of the height of the formed gate structure. Therefore, the electric field control capability of the gate structure to the fin is weaken, thereby affecting the performance of the semiconductor structure.

On the other hand, when forming the gate structure in the gate opening 106, the material of the work function layer 107 includes titanium nitride, tantalum nitride, titanium aluminum carbide, or a combination thereof, and the work function layer 107 is formed by a deposition process. Because a depth-to-width ratio of the gate opening 106 is substantially large, when forming the work function layer in the gate opening 106 by deposition, the material of the work function layer is preferentially deposited at top of the gate opening 106, such that the top of the gate opening becomes smaller. Therefore, a thickness of the work function layer formed at the bottom of the gate opening 106 is thinner than the thickness of the work function layer formed at the top of the gate opening 106.

When subsequently forming the gate electrode layer on the work function layer, it is difficult for the material of the gate electrode layer to enter the bottom of the gate opening 106, such that a gap appears inside the formed gate electrode layer. Therefore, the function of the gate structure is affected, and the performance of the semiconductor structure is further affected. At the same time, because the depth-to-width ratio of the gate opening 106 is substantially large, when removing a portion of the work function layer, it is difficult to fully remove the work function layer, and the remaining work function layer affects the performance of the semiconductor structure.

The present disclosure provides a semiconductor structure and a fabrication method thereof. A modified sidewall spacer may be formed by performing a modification process on a sidewall spacer exposed by a first opening, and the modified sidewall spacer and the dummy gate dielectric layer may be simultaneously removed. Therefore, the top size of subsequently formed third opening may become substantially large. When subsequently forming a gate structure in the third opening, a material of the gate structure may easily fill the third opening to form a gate structure with a dense structure, such that the formed gate structure may have desired device performance.

Figure 10:
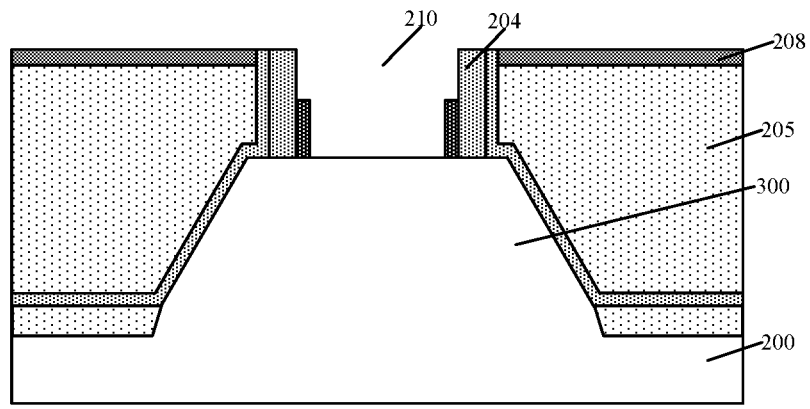
Figure 11:
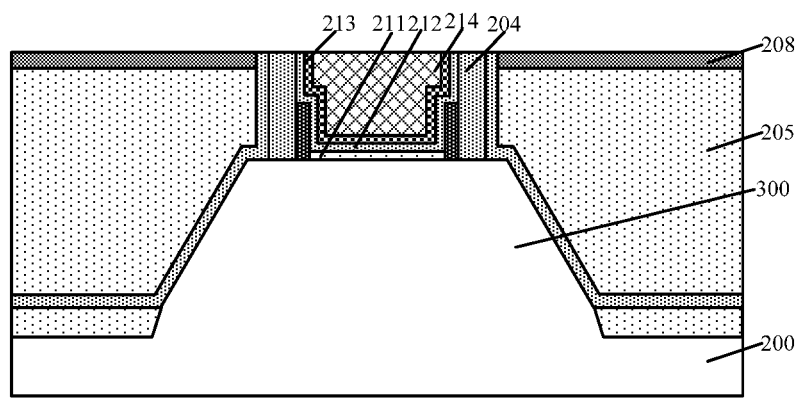
Figure 12:
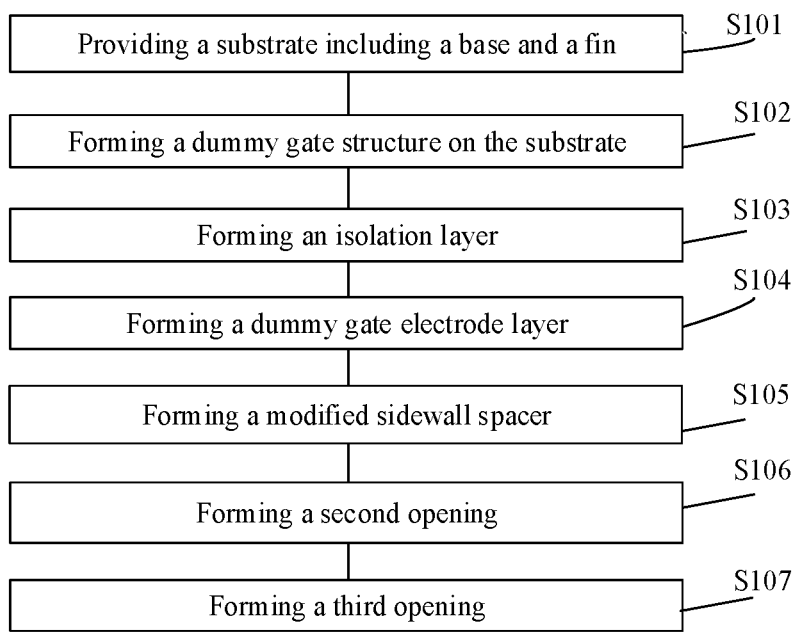
FIG. 12 illustrates a flowchart of an exemplary method for forming a semiconductor structure consistent with various disclosed embodiments of the present disclosure.

FIG. 12 illustrates an exemplary method for forming a semiconductor structure consistent with various disclosed embodiments of the present disclosure; and FIGS. 4-11 illustrate semiconductor structures corresponding to certain stages of the fabrication method.

Figure 4:
FIGS. 4-11 illustrate semiconductor structures corresponding to certain stages for forming an exemplary semiconductor structure consistent with various disclosed embodiments of the present disclosure.

As shown in FIG. 12, at the beginning of the fabrication method, a substrate with certain structures may be provided (S101). FIG. 4 illustrates a corresponding semiconductor structure.

Referring to FIG. 4, a substrate with certain structures may be provided. In one embodiment, the substrate may include a base 200 and a fin 300 on the base. In another embodiment, the substrate may be a planar substrate.

In one embodiment, the material of the substrate may include silicon. In another embodiment, the material of the substrate may include silicon germanium, germanium, silicon on insulator, germanium on insulator, or a combination thereof.

In one embodiment, the substrate may further include an isolation structure (not illustrated) on the base 200. The isolation structure may be located on a sidewall of the fin 300, and a surface of the isolation structure may be lower than a top surface of the fin 300. In one embodiment, the material of the isolation structure may include silicon oxide.

Figure 5:
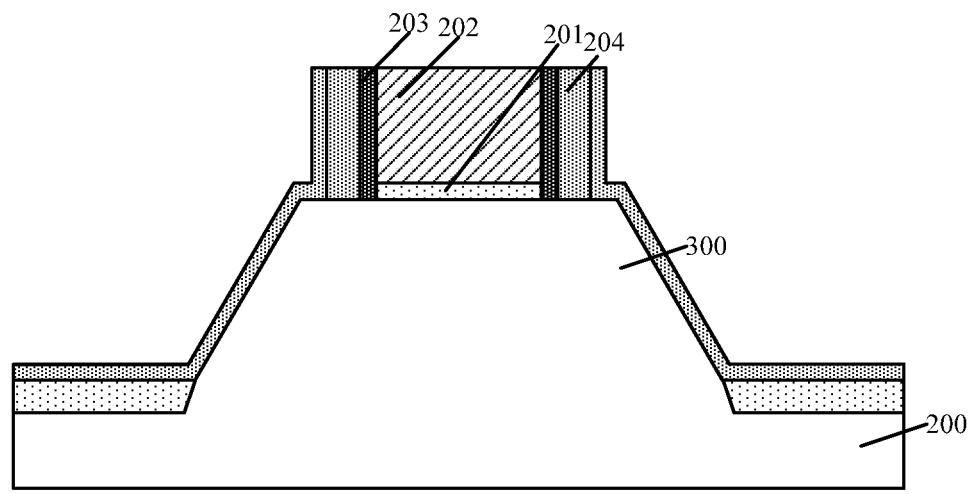

Returning to FIG. 12, after providing the substrate, a dummy gate structure may be formed (S102). FIG. 5 illustrates a corresponding semiconductor structure.

Referring to FIG. 5, a dummy gate structure may be formed over the substrate. The dummy gate structure may include a dummy gate dielectric layer 201 and an initial dummy gate electrode layer 202 on the dummy gate dielectric layer 201. The dummy gate structure may further include a first sidewall spacer 203 on sidewalls of the dummy gate dielectric layer 201 and the initial dummy gate electrode layer 202. In one embodiment, a height of the dummy gate structure may be in a range of approximately 500 nm-1400 nm.

A method for forming the dummy gate structure may include following. A dummy gate dielectric material layer (not illustrated) may be formed over the substrate. A dummy gate electrode material layer (not illustrated) may be formed on a surface of the dummy gate dielectric material layer. A patterned mask layer (not illustrated) may be formed on the dummy gate electrode material layer, and the patterned mask layer may expose a portion of the surface of the dummy gate electrode material layer. The dummy gate electrode material layer and the dummy gate dielectric material layer may be etched using the patterned mask layer as a mask, to form the dummy gate dielectric layer 201 and the initial dummy gate electrode layer 202 on the dummy gate dielectric layer 201 over the substrate. A first sidewall spacer material layer (not illustrated) may be formed on the surface of the substrate, on the sidewall surface of the dummy gate dielectric layer 201, and on the sidewall and top surfaces of the initial dummy gate electrode layer 202. The first sidewall spacer material layer may be back-etched until the top surface of the initial dummy gate electrode layer 202 is exposed, to form the first sidewall spacer 203 on the sidewalls of the dummy gate dielectric layer 201 and the initial dummy gate electrode layer 202.

In one embodiment, the material of the dummy gate dielectric layer 201 may include silicon oxide. The process of forming the dummy gate dielectric material layer may include an atomic layer deposition process, a chemical vapor deposition process, and an in-situ steam generation (ISSG) process. In one embodiment, the process of forming the dummy gate dielectric material layer may include an atomic layer deposition process.

In one embodiment, the material of the initial dummy gate electrode layer 202 may include polysilicon. The process of forming the dummy gate electrode material layer may include a physical vapor deposition process, an epitaxial growth process, or a combination thereof. In one embodiment, the process of forming the dummy gate electrode material layer may include a physical vapor deposition process.

The material of the first sidewall spacer 203 may include a low dielectric constant material, and a dielectric constant of the low dielectric constant material may be less than 3.9. The low dielectric constant material may include an inorganic porous material, an organic porous material, or a combination thereof. The inorganic porous material may include a silicon oxide porous material, a silicon nitride porous material, a compound containing silicon, nitrogen, oxygen and carbon, or a combination thereof. The organic porous material may include a polyimide porous material, a polyethylene porous material, a polysilazane porous material, or a combination thereof.

In one embodiment, the low dielectric constant material may include a compound containing silicon, nitrogen, oxygen, and carbon. The low dielectric constant material may reduce a leakage current of the gate structure, and may reduce the capacitance effect of the gate structure, thereby reducing the signal crosstalk between the gate structure and any other semiconductor structure, and further improving the performance of the semiconductor structure.

The process of forming the first sidewall spacer material layer may include a chemical vapor deposition process, an atomic layer deposition process, or a combination thereof. In one embodiment, the process of forming the first sidewall spacer material layer may include an atomic layer deposition process.

In one embodiment, the method may further include forming a second sidewall spacer 204 over the sidewall of the dummy gate structure; and forming a stop layer (not illustrated) on the sidewall of the second sidewall spacer 204 and on the surface of the substrate. The second sidewall spacer 204 and the first sidewall spacer 203 may together protect subsequently formed gate structure.

The stop layer may serve as an etching stop layer for the subsequent etching process, to prevent the surface of the substrate and the sidewall of the second sidewall spacer 204 from being damaged by the etching process. In one embodiment, the material of the second sidewall spacer 204 may include silicon nitride. In another embodiment, the material of the second sidewall spacer may include silicon oxide. In one embodiment, the material of the stop layer may include silicon nitride.

Figure 6:
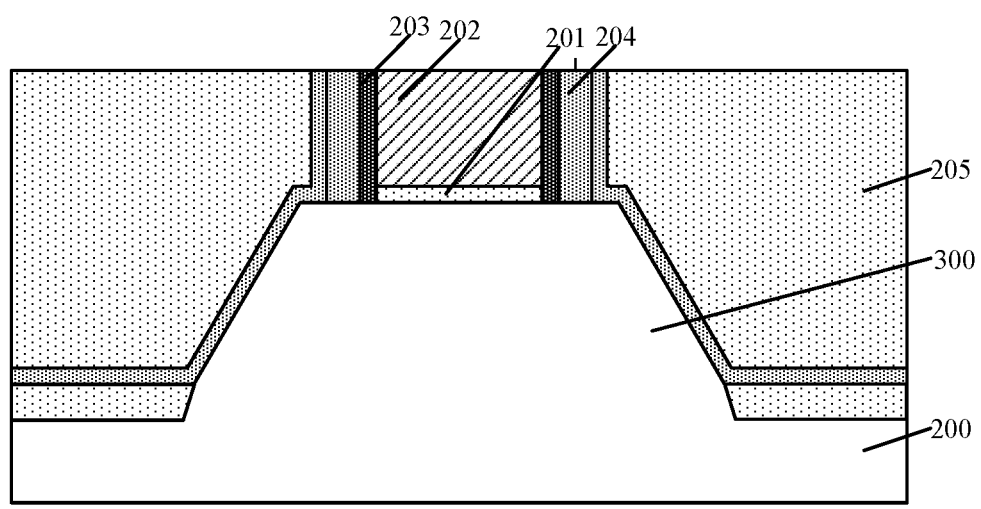

Returning to FIG. 12, after forming the dummy gate structure, an isolation layer may be formed (S103). FIG. 6 illustrates a corresponding semiconductor structure.

Referring to FIG. 6, an isolation layer 205 may be formed over the substrate. The isolation layer 205 may be located over the isolation structure, and the isolation layer 205 may expose the surface of the dummy gate structure. The surface of the isolation layer 205 may be lower than or coplanar with the surface of the dummy gate structure.

The method of forming the isolation layer 205 may include forming an isolation material layer (not illustrated) over the surface of the substrate, on the top and sidewall surfaces of the dummy gate structure; and planarizing the isolation material layer until the surface of the initial dummy gate electrode layer 202 is exposed to form the isolation layer 205.

In one embodiment, the material of the isolation layer 205 may include silicon oxide. In another embodiment, the material of the isolation layer may include silicon nitride, silicon oxynitride, or a combination thereof. The process of forming the isolation material layer may include an atomic layer deposition process, a chemical vapor deposition process, or a combination thereof. In one embodiment, the process of forming the isolation material layer may include a chemical vapor deposition process.

Figure 7:
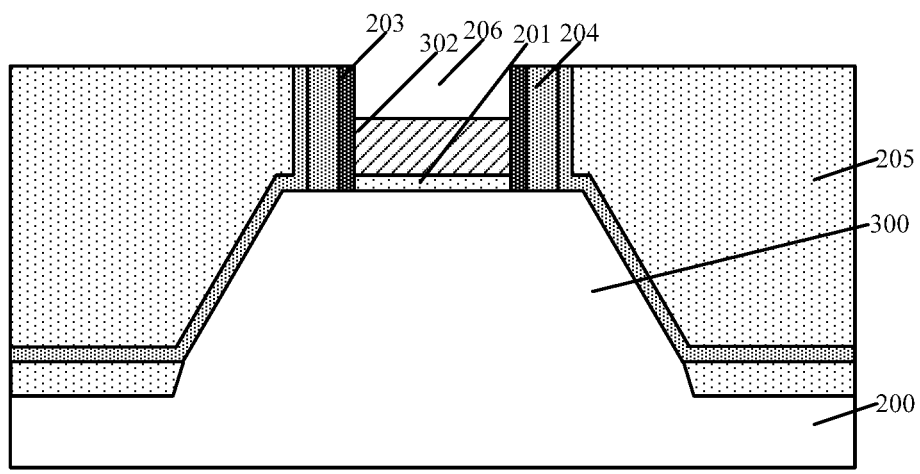

Returning to FIG. 12, after forming the isolation layer, a dummy gate electrode layer may be formed (S104). FIG. 7 illustrates a corresponding semiconductor structure.

Referring to FIG. 7, a dummy gate electrode layer 302 may be formed by removing a portion of the initial dummy gate electrode layer 202. Therefore, a surface of the dummy gate electrode layer 302 may be lower than the surface of the isolation layer 205. A first opening 206 may be formed in the isolation layer 205, and the first opening 206 may expose a portion of the sidewall surface of the first sidewall spacer 203.

In one embodiment, the process of removing the portion of the initial dummy gate electrode layer 202 may include a dry etching process. The portion of the initial dummy gate electrode layer 202 may be first removed by a dry etching process, therefore, when subsequently removing the dummy gate electrode layer 302 by a wet etching process, the process difficulty may be substantially less.

In one embodiment, a height of the dummy gate electrode layer 302 may be approximately ½ to 1 (for example, approximately ½ to ⅔) of a height of the initial dummy gate electrode layer 202. Then, a height of the removed portion of the initial dummy gate electrode layer 202 in a direction perpendicular to the surface of the substrate may be approximately ⅓ to ½ of the height of the initial dummy gate electrode layer 202. In one embodiment, the height of the removed portion of the initial dummy gate electrode layer 202 may be in a range of approximately 250 nm-500 nm.

If the height of the removed portion of the initial dummy gate electrode layer is too small, the height of the first sidewall spacer 203 exposed by the formed first opening 206 may be substantially small. When subsequently modifying and removing the exposed first sidewall spacer 203, the depth-to-width ratio of a second opening formed by removing the dummy gate electrode layer may be still large. When filling the second opening, the material of the gate structure may still have a poor filling issue, which may not facilitate to effectively improve the performance of the semiconductor structure. If the height of the removed portion of the initial dummy gate electrode layer is too large, the dry etching process for removing the portion of the initial dummy gate electrode layer may etch the fin at the bottom of the dummy gate electrode layer, thereby causing damages to the fin and affecting the performance of the semiconductor structure.

The height of the removed portion of the initial dummy gate electrode layer 202 may be ⅓ to ½ of the height of the initial dummy gate electrode layer 202, such that the height of the exposed first sidewall spacer 203 by the first opening 206 may be ⅓ to ½ of the height of the first sidewall spacer 203. After subsequently modifying and removing the first sidewall spacer 203, a size of the top of the formed third opening may be substantially large, which may facilitate the subsequent filling of the material of the gate structure.

Figure 8:
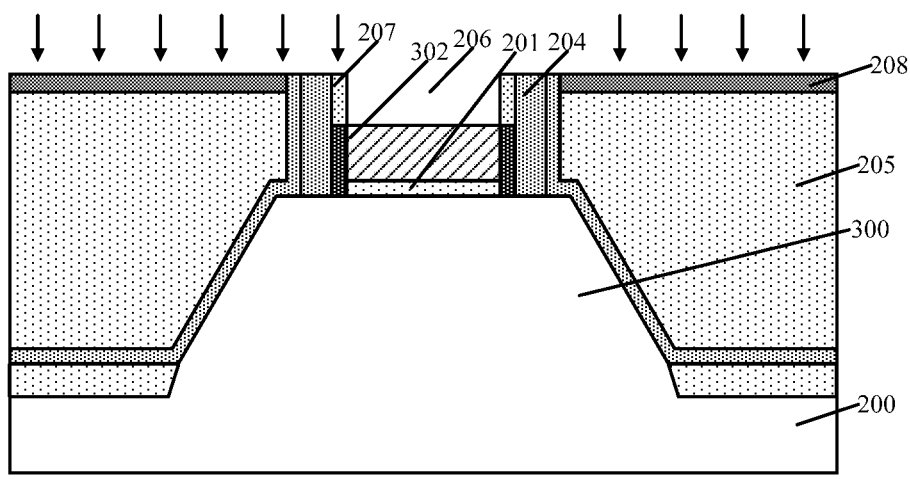

Returning to FIG. 12, after forming the dummy gate electrode layer, a modified sidewall spacer may be formed (S105). FIG. 8 illustrates a corresponding semiconductor structure.

Referring to FIG. 8, a modification process may be performed on the first sidewall spacer 203 exposed by the first opening 206, such that a modified sidewall spacer 207 may be formed from the exposed first sidewall spacer 203.

In one embodiment, while performing the modification process on the first sidewall spacer 203, the modification process may also be performed on the isolation layer 205 to form a modified isolation layer 208 from the surface of the isolation layer 205. In another embodiment, the modified isolation layer 208 and the modified sidewall spacer 207 may not be simultaneously formed.

In one embodiment, the modification process may include an ion implantation process. Parameters of the ion implantation process may include an ion type including argon ion, fluoride ion, phosphorus ion, oxygen ion, silicon ion, or a combination thereof; an ion implantation angle in a range of approximately 15°-60°; an ion energy in a range of approximately 10 keV-60 keV; and an ion dose in a range of approximately $1 \times 10^{15}$ atoms/cm$^3$-$5 \times 10^{16}$ atoms/cm$^3$.

In one embodiment, the modification process may be an ion implantation process. The implanted ion may include argon ion, fluoride ion, phosphorus ion, oxygen ion, silicon ion, or a combination thereof. The argon ion, fluoride ion, phosphorus ion, oxygen ion, or silicon ion may have a substantially large ion radius. After the ions enter the first sidewall spacer and the isolation layer, the structural properties of the first sidewall spacer and the isolation layer may change. Therefore, under the subsequent process condition of removing the dummy gate dielectric layer, the modified sidewall spacer may have a substantially large etching rate, and the modified sidewall spacer may be simultaneously removed while removing the dummy gate dielectric layer. The modified isolation layer may have an etching rate less than the dummy gate dielectric layer, such that when removing the dummy gate dielectric layer, the modified isolation layer may be etched to a lesser extent. The height of the isolation layer may determine the effective height of a subsequently formed gate structure. Therefore, the subsequently formed gate structure may have a substantially large height, and the electric field control capability of the gate structure may be substantially strong, thereby improving the performance of the semiconductor structure.

Figure 9:
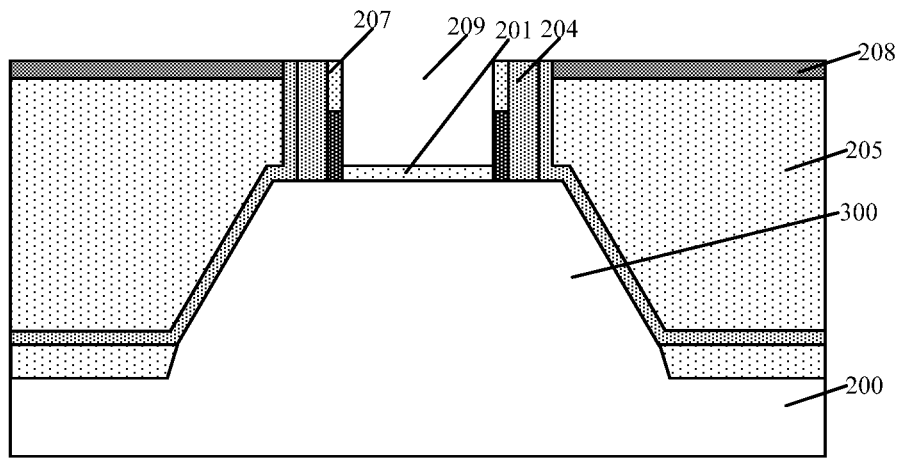

Returning to FIG. 12, after forming the modified sidewall spacer, a second opening may be formed (S106). FIG. 9 illustrates a corresponding semiconductor structure.

Referring to FIG. 9, the dummy gate electrode layer 302 at the bottom of the first opening 206 may be removed to form a second opening 209 in the isolation layer. The second opening 209 may expose the surface of the dummy gate dielectric layer 201. In one embodiment, the process of removing the dummy gate electrode layer 302 at the bottom of the first opening 206 to form the second opening 209 may include a wet etching process.

The portion of the initial dummy gate electrode layer 202 may be first removed by a dry etching process, and then the dummy gate electrode layer 302 may be removed by a wet etching process. Therefore, the issue of damages on the surfaces of the dummy gate dielectric layer 201 and the substrate caused by using a single dry etching process may be prevented. The issue of not fully removing the initial dummy gate electrode layer 202 caused by untimely discharge of the reaction by-products of the initial dummy gate electrode layer 202 due to a substantially large depth-to-width ratio of the second opening when using a single wet etching process may be prevented.

Returning to FIG. 12, after forming the second opening, a third opening may be formed (S107). FIG. 10 illustrates a corresponding semiconductor structure.

Referring to FIG. 10, the dummy gate dielectric layer 201 at the bottom of the second opening 209 and the modified sidewall spacer 207 may be removed by etching, to form a third opening 210 in the isolation layer.

When removing the dummy gate dielectric layer 201 at the bottom of the second opening 209 by etching, the etching rate of the modified sidewall spacer 207 may be substantially large, such that the modified sidewall spacer 207 and the dummy gate dielectric layer 201 may be removed at the same time.

In one embodiment, the size of the top of the third opening 210 in a direction parallel to the surface of the base 200 may be larger than the size of the bottom of the third opening 210 in the direction parallel to the surface of the base 200.

The size of the top of the third opening 210 in the direction parallel to the surface of the base 200 may be larger than the size of the bottom of the third opening 210 in the direction parallel to the surface of the base 200, such that when subsequently forming a gate structure in the third opening 210, the material of the gate structure may easily fill the third opening to form a gate structure with a dense structure in the third opening 210, and the formed gate structure may have desired performance.

The etching rate of the dummy gate dielectric layer 201 may be greater than the etching rate of the modified isolation layer 208, and the etching rate of the modified sidewall spacer 207 may be greater than the etching rate of the modified isolation layer 208.

The isolation layer 205 may be modified to form the modified isolation layer 208. Therefore, when removing the dummy gate dielectric layer 201, the etching rate of the modified isolation layer 208 may be less than the etching rate of the dummy gate dielectric layer 201. When removing the dummy gate dielectric layer 201, the modified isolation layer 208 may be etched to a lesser extent. The height of the isolation layer may determine the effective height of the subsequently formed gate structure, such that the gate structure subsequently formed in the third opening 210 may have a substantially large height, and the electric field control capability of the gate structure may be substantially strong, thereby improving the performance of the semiconductor structure.

In one embodiment, the process of removing the dummy gate dielectric layer 201 at the bottom of the second opening 209 and the modified sidewall spacer 207 may include a dry etching process. In one embodiment, the etching gas of the dry etching process may include a mixed gas of hydrogen fluoride and ammonia gas. The mixed gas of hydrogen fluoride and ammonia gas may have a substantially great etching rate for the dummy gate dielectric layer 201 and the modified sidewall spacer 207, and may have a substantially low etching rate for the modified isolation layer 208. Therefore, the dummy gate dielectric layer 201 and the modified sidewall spacer 207 may be fully removed, and at the same time, the modified isolation layer 208 may be etched to a lesser extent, which may facilitate to subsequently form the gate structure with a substantially large height.

Next, a gate structure may be formed in the third opening 210. The gate structure may include a gate dielectric layer, a work function layer on the gate dielectric layer, and a gate electrode layer on the work function layer.

Returning to FIG. 12, after forming the third opening, a transition layer and a gate structure may be formed (S108). FIG. 11 illustrates a corresponding semiconductor structure.

Referring to FIG. 11, after forming the third opening 210, a transition layer 211 may be formed at the bottom of the third opening 210. The transition layer 211 may be used to isolate a subsequently formed gate dielectric layer and the substrate, to prevent ions in the gate dielectric layer from diffusing into the substrate to affect the performance of the semiconductor structure.

In one embodiment, the material of the transition layer 211 may include silicon oxide. The process of forming the transition layer 211 may include an atomic layer deposition process, a chemical vapor deposition process, a thermal treatment process, or a combination thereof.

In one embodiment, the process of forming the transition layer 211 may include a thermal treatment process. The thermal treatment process may form the transition layer 211 with a substantially dense structure and a substantially thin thickness.

Referring to FIG. 11, a gate structure may be formed on the transition layer 211. The gate structure may include a gate dielectric layer 212, a work function layer 213 on the gate dielectric layer 212, and a gate electrode layer 214 on the work function layer 213.

A method for forming the gate structure may include: forming a gate dielectric material layer (not illustrated) on an inner wall of the third opening 210; forming a work function material layer (not illustrated) on the gate dielectric material layer; forming a gate electrode material layer (not illustrated) on the work function material layer; and planarizing the gate electrode material layer, the work function material layer and the gate dielectric material layer until the surface of the modified isolation layer 208 is exposed to form the gate structure in the third opening 210.

The size of the top of the third opening 210 in the direction parallel to the surface of the base 200 may be greater than the size of the bottom of the third opening 210 in the direction parallel to the surface of the base 200. Then, when forming the gate structure in the third opening 210, the work function layer and the gate electrode layer may be formed by a deposition process. The materials of the work function layer and the gate electrode layer may easily fill the third opening to form the gate structure with a substantially dense structure in the third opening 210, such that the formed gate structure may have desired performance.

In one embodiment, the material of the gate dielectric layer 212 may include a high-K (greater than 3.9) material, and the high-K material may include hafnium oxide, aluminum oxide, or a combination thereof. The process of forming the gate dielectric material layer may include a chemical vapor deposition process, an atomic layer deposition process, an in-situ steam generation process, or a combination thereof. In one embodiment, the process of forming the gate dielectric material layer may include an atomic layer deposition process. The atomic layer deposition process may form the gate dielectric material layer with a substantially dense structure and a substantially thin thickness.

In one embodiment, the material of the work function layer 213 may include tantalum nitride, titanium aluminum, titanium nitride, or a combination thereof. The process of forming the work function material layer may include a chemical vapor deposition process, an atomic layer deposition process, or a combination thereof. In one embodiment, the process of forming the work function material layer may include an atomic layer deposition process.

In one embodiment, the material of the gate electrode layer 214 may include metal including tungsten. The process of forming the gate electrode material layer may include a physical vapor deposition process, an electroplating process, or a combination thereof. In one embodiment, the process of forming the gate electrode material layer may include a physical vapor deposition process.

In one embodiment, the process of planarizing the gate electrode material layer, the work function material layer, and the gate dielectric material layer may include a chemical mechanical polishing process. Therefore, the formed gate structure may have a dense structure, and the gate structure may have desired performance.

The present disclosure also provides a semiconductor structure. Referring to FIG. 11, the semiconductor structure may include a substrate, and a gate structure formed over the substrate. In one embodiment, the substrate may include a base 200 and a fin 300 on the base. The gate structure may include a gate dielectric layer, a work function layer on the gate dielectric layer, and a gate electrode layer on the work function layer. The semiconductor structure may also include a first sidewall spacer formed over the substrate on a side of the gate structure, and a second sidewall spacer formed over the substrate on a side of the first sidewall spacer. The second sidewall spacer may have a height greater than the first sidewall spacer. The gate dielectric layer may be formed at least on sidewalls of the first sidewall spacer and the second sidewall spacer. The gate dielectric layer may be further formed on a top surface of the first sidewall spacer.

In one embodiment, the semiconductor structure may also include a transition layer formed between the gate dielectric layer and the substrate, and between first sidewall spacers.

In the disclosed method for forming the semiconductor structure, the modification process may be performed on the first sidewall spacer exposed by the first opening to form the modified sidewall spacer. Thus, when removing the dummy gate dielectric layer, the modified sidewall spacer may have a substantially large etching rate, and the modified sidewall spacer may be simultaneously removed while removing the dummy gate dielectric layer. Therefore, the size of top of the subsequently formed third opening in the direction parallel to the surface of the substrate may be larger than the size of bottom of the third opening in the direction parallel to the surface of the substrate. When subsequently forming the gate structure in the third opening, the material of the gate structure may easily fill the third opening to form a gate structure with a dense structure, such that the formed gate structure may have desired device performance.

In addition, the modification process may be an ion implantation process. The implanted ion may include argon ion, fluoride ion, phosphorus ion, oxygen ion, silicon ion, or a combination thereof. The argon ion, fluoride ion, phosphorus ion, oxygen ion, or silicon ion may have a substantially large ion radius. After the ions enter the first sidewall spacer, the structural properties of the first sidewall spacer may change. Therefore, under the process condition of removing the dummy gate dielectric layer, the modified sidewall spacer may have a substantially large etching rate, and the modified sidewall spacer may be simultaneously removed while removing the dummy gate dielectric layer.

Further, the modification process may be performed on the isolation layer to form a modified isolation layer, and when removing the dummy gate dielectric layer, the modified isolation layer may have an etching rate less than the dummy gate dielectric layer. Therefore, when removing the dummy gate dielectric layer, the modified isolation layer may be etched to a lesser extent. The height of the isolation layer may determine the effective height of the subsequently formed gate structure. Therefore, the gate structure subsequently formed in the third opening may have a substantially large height, and the electric field control capability of the gate structure may be substantially strong, thereby improving the device performance of the semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor structure, comprising:
   providing a substrate;
   forming a dummy gate structure over the substrate, wherein the dummy gate structure includes:
   a dummy gate dielectric layer,
   an initial dummy gate electrode layer on the dummy gate dielectric layer, and a first sidewall spacer on sidewalls of the dummy gate dielectric layer and the initial dummy gate electrode layer;

forming an isolation layer over the substrate, wherein the isolation layer exposes a surface of the dummy gate structure, and a surface of the isolation layer is lower than or coplanar with the surface of the dummy gate structure;

forming a dummy gate electrode layer by removing a portion of the initial dummy gate electrode layer, wherein a surface of the dummy gate electrode layer is lower than the surface of the isolation layer, and a first opening exposing a portion of a sidewall surface of the first sidewall spacer is formed in the isolation layer;

performing a modification process on a top portion of the first sidewall spacer exposed by the first opening to completely convert the top portion of the first sidewall spacer to a modified sidewall spacer;

forming a second opening in the isolation layer by removing the dummy gate electrode layer at a bottom of the first opening;

forming a third opening in the isolation layer by simultaneously removing the dummy gate dielectric layer at a bottom of the second opening to expose the substrate and the top portion of the first sidewall spacer, wherein a size of top of the third opening in a direction parallel to a surface of the substrate is larger than a size of bottom of the third opening in the direction parallel to the surface of the substrate; and forming a gate structure in the third opening.

2. The method according to claim 1, wherein:
the modification process includes an ion implantation process.

3. The method according to claim 2, wherein parameters of the ion implantation process include:
an ion type, including argon ion, fluoride ion, phosphorus ion, oxygen ion, silicon ion, or a combination thereof;
an ion implantation angle in a range of approximately 15°-60°;
ion energy in a range of approximately 10 keV-60 keV; and
an ion dose in a range of approximately $1\times10^{15}$ atoms/cm$^3$-$5\times10^{16}$ atoms/cm$^3$.

4. The method according to claim 1, wherein:
removing the dummy gate dielectric layer at the bottom of the second opening and the modified sidewall spacer includes a dry etching process.

5. The method according to claim 4, wherein:
an etching gas of the dry etching process includes a mixed gas of hydrogen fluoride and ammonia gas.

6. The method according to claim 1, further including:
while performing the modification process on the first sidewall spacer, performing the modification process on the isolation layer to convert a top portion of the isolation layer into a modified isolation layer on a remaining portion of the isolation layer, and
forming a second sidewall spacer over the substrate on a side of the first sidewall spacer, wherein sidewall surfaces of the second sidewall spacer are exposed after the top portion of the first sidewall spacer is removed.

7. The method according to claim 6, wherein:
when removing the dummy gate dielectric layer at the bottom of the second opening and the modified sidewall spacer by etching, an etching rate of the dummy gate dielectric layer is greater than an etching rate of the modified isolation layer, and an etching rate of the modified sidewall spacer is greater than the etching rate of the modified isolation layer.

8. The method according to claim 1, wherein:
a material of the first sidewall spacer includes a low dielectric constant material having a dielectric constant less than 3.9,
the low dielectric constant material includes an inorganic porous material, an organic porous material, or a combination thereof,
the inorganic porous material includes a silicon oxide porous material, a silicon nitride porous material, a compound containing silicon, nitrogen, oxygen and carbon, or a combination thereof, and
the organic porous material includes a polyimide porous material, a polyethylene porous material, a polysilazane porous material, or a combination thereof.

9. The method according to claim 1, after forming the third opening and before forming the gate structure in the third opening, further including:
forming a transition layer at a bottom of the third opening.

10. The method according to claim 9, wherein:
the transition layer is made of a material including silicon oxide.

11. The method according to claim 10, wherein:
forming the transition layer includes an atomic layer deposition process, a chemical vapor deposition process, a thermal treatment process, or a combination thereof.

12. The method according to claim 1, wherein:
forming the first opening by removing the portion of the initial dummy gate electrode layer includes a dry etching process.

13. The method according to claim 1, wherein:
forming the second opening by removing the dummy gate electrode layer at the bottom of the first opening includes a wet etching process.

14. The method according to claim 1, wherein:
the gate structure includes a gate dielectric layer, a work function layer on the gate dielectric layer, and a gate electrode layer on the work function layer.

15. The method according to claim 14, wherein forming the gate structure includes:
forming a gate dielectric material layer on an inner wall of the third opening,
forming a work function material layer on the gate dielectric material layer,
forming a gate electrode material layer on the work function material layer, and
planarizing the gate electrode material layer, the work function material layer and the gate dielectric material layer until the surface of the isolation layer is exposed to form the gate structure in the third opening.

16. The method according to claim 1, wherein:
the substrate includes a base and a fin on the base, and the dummy gate structure is across the fin.

17. The method according to claim 1, wherein:
a height of the removed portion of the initial dummy gate electrode layer in a direction perpendicular to the surface of the substrate is approximately ⅓ to ½ of a height of the initial dummy gate electrode layer; and
the height of the removed portion of the initial dummy gate electrode layer is in a range of approximately 250 nm-500 nm.

* * * * *